US010411425B2

United States Patent
Roh et al.

(10) Patent No.: US 10,411,425 B2
(45) Date of Patent: Sep. 10, 2019

(54) MODULAR CONNECTOR WITH PRINTED CIRCUIT BOARD INTERCONNECTION TO DISPLAY DEVICE

(71) Applicant: SAMSUNG ELECTRONICS CO., LTD., Suwon-si (KR)

(72) Inventors: Woo Su Roh, Suwon-si (KR); Chin Yong You, Hwaseong-si (KR); Ji Hyun Lee, Suwon-si (KR); Woo Sub Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/781,368

(22) PCT Filed: Feb. 1, 2017

(86) PCT No.: PCT/KR2017/001065
§ 371 (c)(1),
(2) Date: Jun. 4, 2018

(87) PCT Pub. No.: WO2017/135664
PCT Pub. Date: Aug. 10, 2017

(65) Prior Publication Data
US 2018/0366891 A1 Dec. 20, 2018

(30) Foreign Application Priority Data
Feb. 4, 2016 (KR) .................. 10-2016-0013865

(51) Int. Cl.
*H01R 31/06* (2006.01)
*H01R 12/70* (2011.01)
(Continued)

(52) U.S. Cl.
CPC ......... *H01R 31/06* (2013.01); *H01R 12/7082* (2013.01); *H01R 12/716* (2013.01);
(Continued)

(58) Field of Classification Search
CPC ............ H01R 4/26; H01R 13/648; G02F 1/13
(Continued)

(56) References Cited

U.S. PATENT DOCUMENTS 5,097,388 A * 3/1992 Buist .................. G06F 1/18
361/679.4
7,221,410 B2 * 5/2007 Choi .................. H04N 5/44
348/554

(Continued)

FOREIGN PATENT DOCUMENTS

CN 202712655 U 1/2013
DE 202011000506 U1 1/2012
(Continued)

OTHER PUBLICATIONS

International Search Report dated Apr. 20, 2017 by the International Searching Authority in counterpart International Application No. PCT/KR2017/001065. (PCT/ISA/210).
(Continued)

*Primary Examiner* — Tulsidas C Patel
*Assistant Examiner* — Peter G Leigh
(74) *Attorney, Agent, or Firm* — Sughrue Mion, PLLC

(57) ABSTRACT

Disclosed herein are a connector capable of efficiently utilizing a space of a display device and a modular connector including a plurality of ports. A connector configured to be mounted on a display device receiving a signal from an external device, the connector comprises a body, a plurality of connection terminals provided on one side of the body and connected to a cable to which the external device is connected, and a printed circuit board (PCB) connection terminal provided on the other side of the body and mounted on the display device, wherein the body, the plurality of connection terminals, and the PCB connection terminal are provided as a single module.

12 Claims, 6 Drawing Sheets

(51) Int. Cl.
*H01R 12/71* (2011.01)
*H01R 13/66* (2006.01)
*H01R 31/00* (2006.01)
*H04N 5/64* (2006.01)
*H05K 5/00* (2006.01)

(52) U.S. Cl.
CPC ....... *H01R 13/6658* (2013.01); *H01R 31/005* (2013.01); *H04N 5/64* (2013.01); *H01R 2201/18* (2013.01); *H05K 5/0017* (2013.01); *H05K 5/0026* (2013.01)

(58) Field of Classification Search
USPC ........................................ 439/579, 638, 926
See application file for complete search history.

(56) References Cited

U.S. PATENT DOCUMENTS

| | | | | | |
|---|---|---|---|---|---|
| 7,233,486 | B2* | 6/2007 | Kim | ...................... | G06F 1/1601 349/58 |
| 7,471,511 | B2* | 12/2008 | Montag | ................. | G06F 1/1601 348/730 |
| 7,477,510 | B2* | 1/2009 | Liu | ........................... | G06F 1/16 361/679.08 |
| 7,585,184 | B2* | 9/2009 | Su | ........................ | H01R 13/567 439/579 |
| 7,796,772 | B2* | 9/2010 | Takahashi | ............ | H04R 1/2819 361/679.23 |
| 7,813,118 | B2* | 10/2010 | Burge | .................. | F16M 11/105 361/679.21 |
| 8,348,694 | B2* | 1/2013 | Kah | ..................... | H01R 12/724 439/374 |
| 8,537,532 | B2* | 9/2013 | Chen | ....................... | G06F 1/181 248/917 |
| 8,717,755 | B2* | 5/2014 | Haren | .................. | G06F 1/1607 361/679.41 |
| 9,077,940 | B2* | 7/2015 | Choi | ........................ | H04N 5/64 |
| 2013/0162907 | A1* | 6/2013 | Kim | ........................ | H04N 5/44 348/553 |

FOREIGN PATENT DOCUMENTS

| | | | |
|---|---|---|---|
| JP | 2005-223748 | A | 8/2005 |
| KR | 2003-0097354 | A | 12/2003 |
| KR | 10-2005-0118850 | * | 12/2005 |
| KR | 10-2005-0118850 | A | 12/2005 |
| KR | 10-2006-0061681 | * | 6/2006 |
| KR | 10-2006-0061681 | A | 6/2006 |
| KR | 10-2013-0115933 | A | 10/2013 |

OTHER PUBLICATIONS

Written Opinion dated Apr. 20, 2017 by the International Searching Authority in counterpart International Application No. PCT/KR2017/001065. (PCT/ISA/237).
Communication dated Dec. 17, 2018, issued by the State Intellectual Property Office of People's Republic of China in counterpart Chinese Application No. 201780002224.8.

* cited by examiner

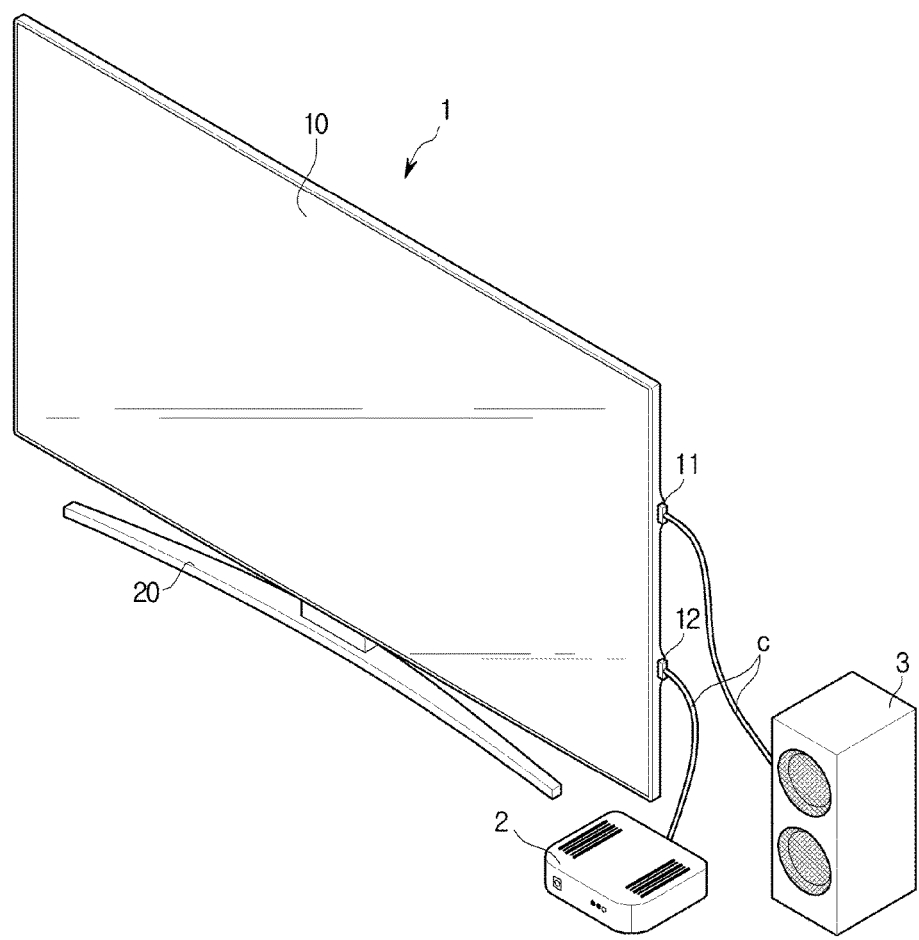
[Fig. 1]

[Fig. 2]
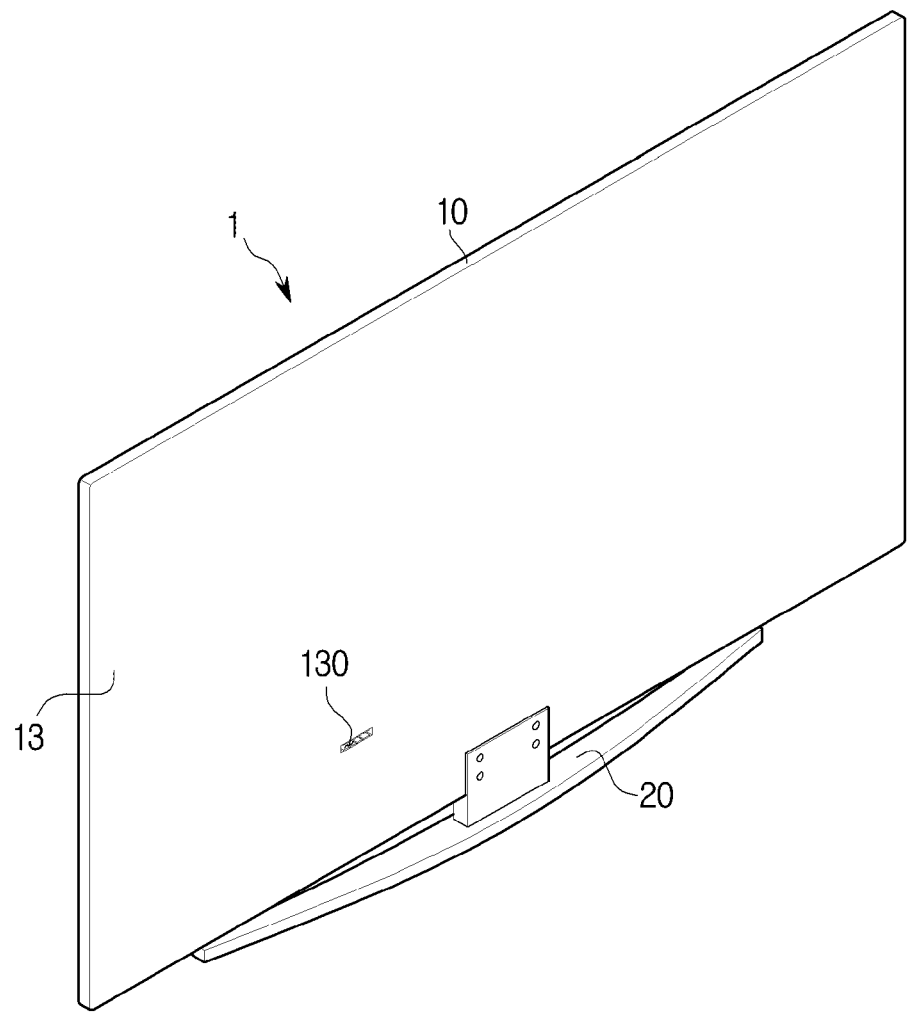
[Fig. 3a]
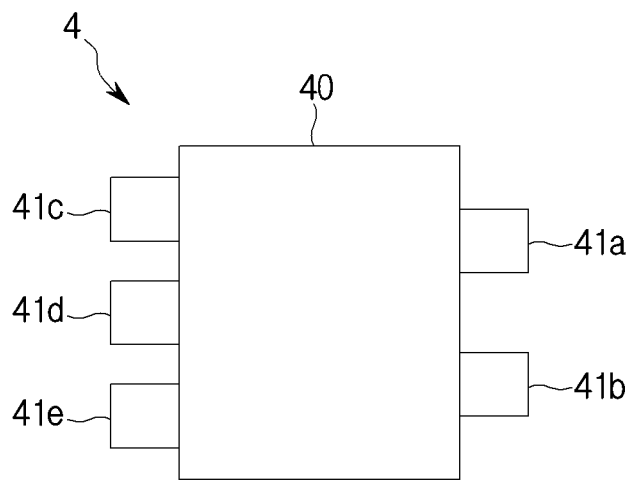

[Fig. 3b]
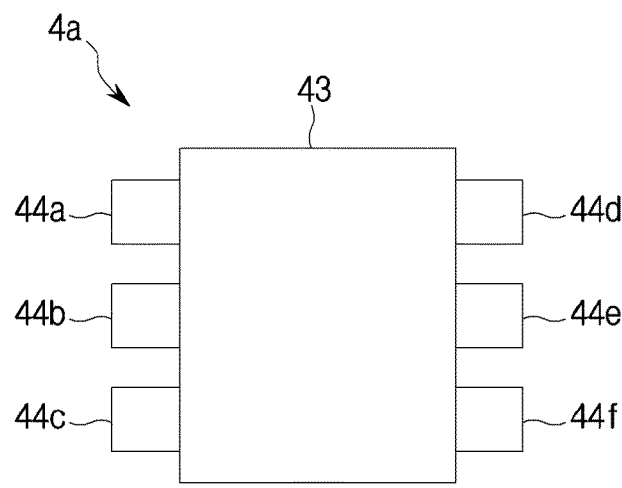
[Fig. 4]
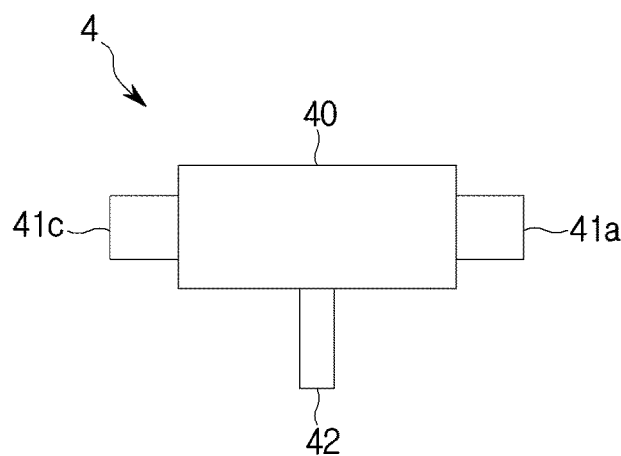
[Fig. 5]
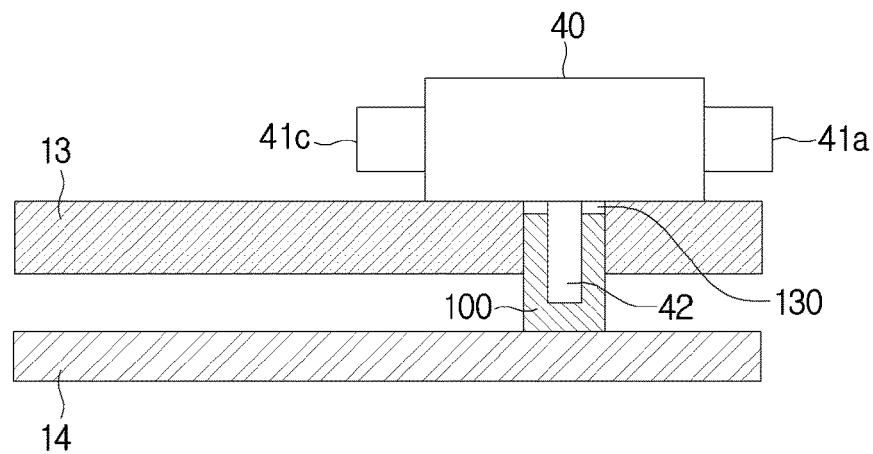

[Fig. 6]
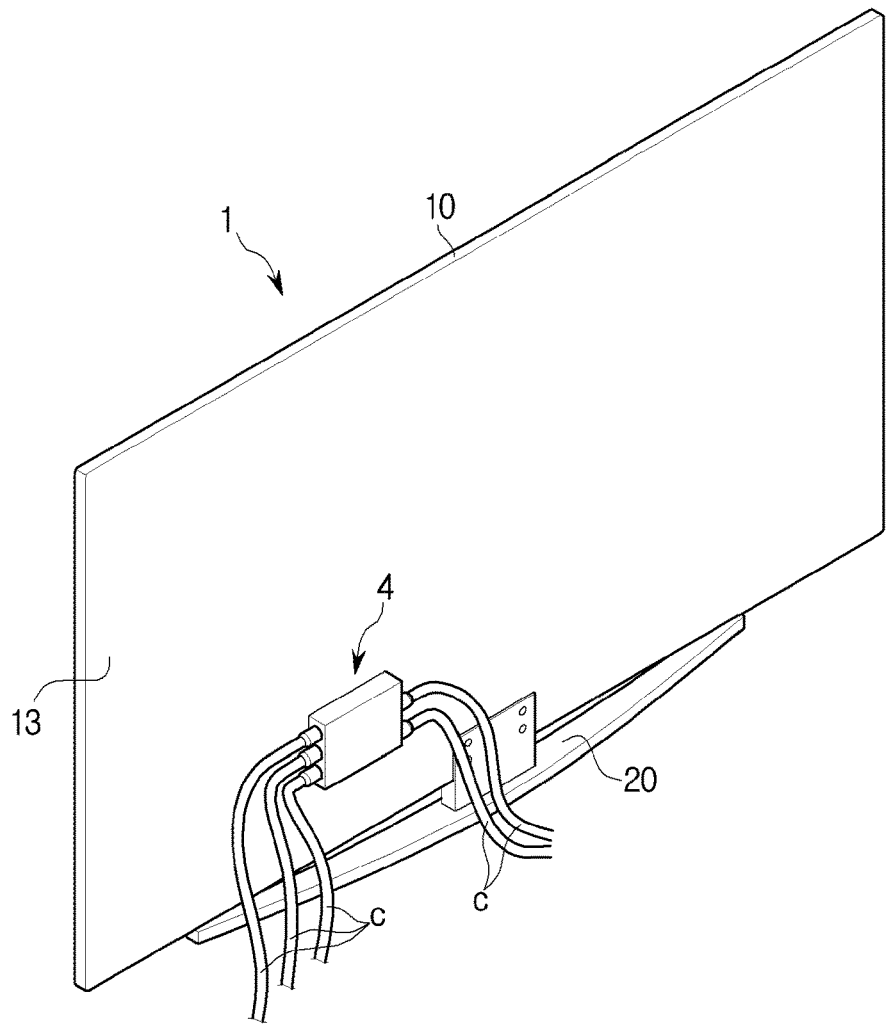
[Fig. 7a]
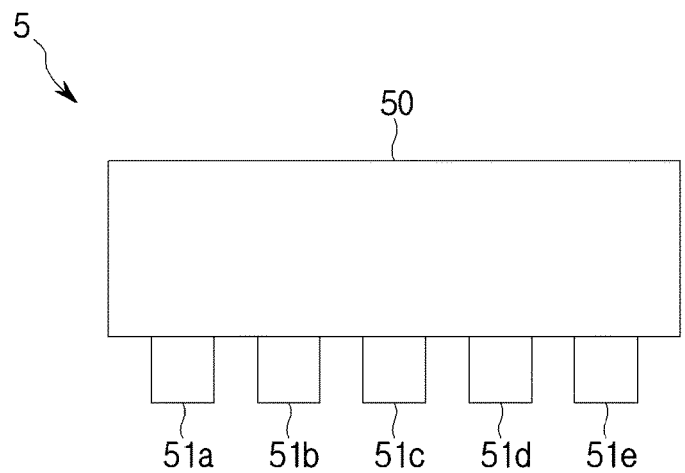

[Fig. 7b]
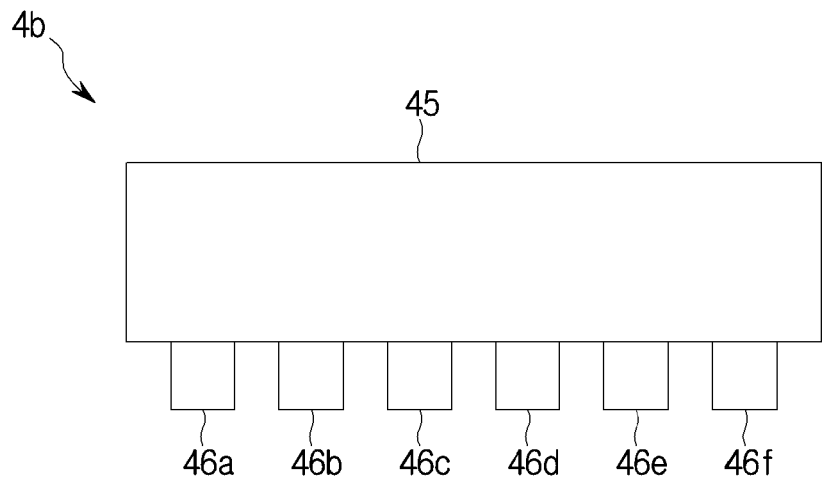
[Fig. 8]
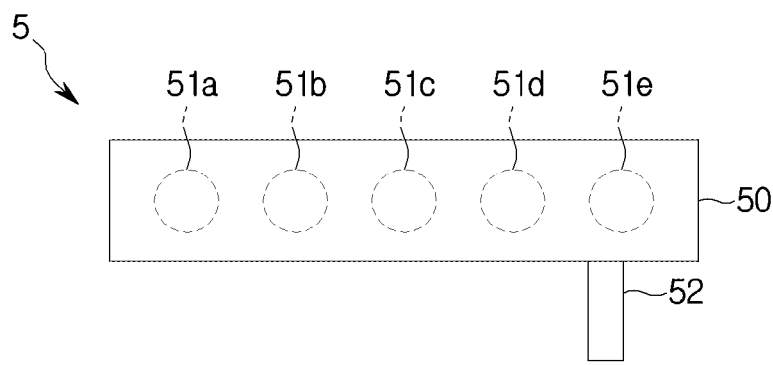
[Fig. 9]
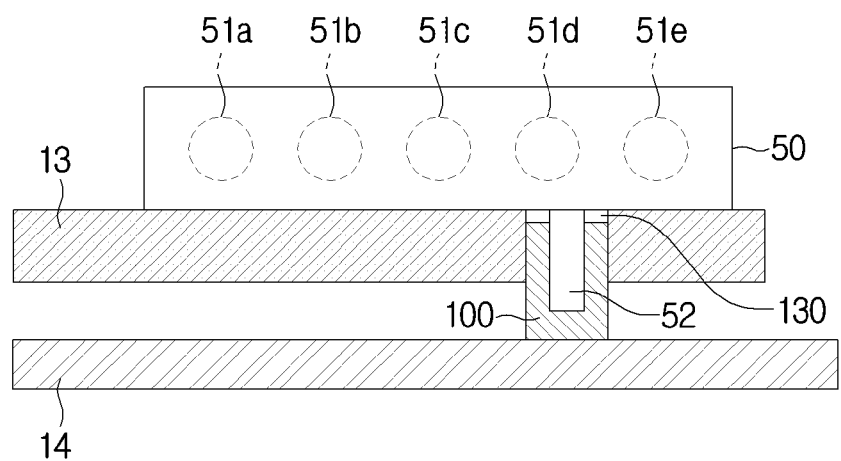

[Fig. 10]
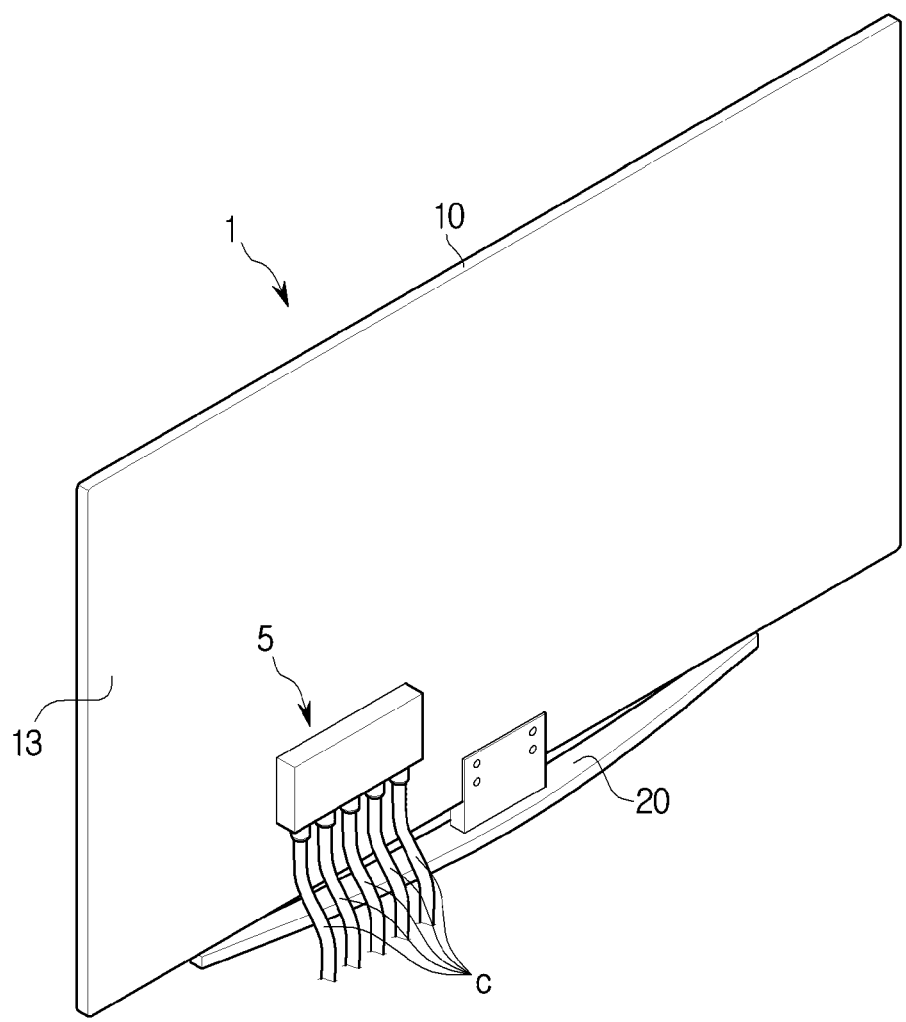

MODULAR CONNECTOR WITH PRINTED CIRCUIT BOARD INTERCONNECTION TO DISPLAY DEVICE

TECHNICAL FIELD

The present disclosure relates to a connector connecting an external input device and a display device.

BACKGROUND ART

A display device is a device for visually displaying data information such as text, figures, and the like. The display devices include mobile phones, notebooks, televisions, and the like. A display device such as a television is provided to be connected to a set-top box or the like to receive a digital signal.

The display device may be provided with an input port capable of receiving a digital signal, and an external device, such as a set-top box or the like, outputting a digital signal may be provided with an output port. When the output port and the input port are connected, a digital signal is transmitted from the external device to the display device and video or audio information may be output to the display device according to the input digital signal.

Conventionally, a video or audio signal transmitted to the display device is formed in an analog type. A video signal and an audio signal are separately output as signals in an analog type. Therefore, a port for receiving a video signal and a port for receiving an audio signal are separately provided on the display device. Recently, a video or audio signal transmitted to a display device tends to be transmitted as a digital signal. However, since external devices transmitting signals in an analog type are still currently used, it is necessary for a recently produced display device to be provided with a method of receiving an analog signal.

Technical Problem

The present invention is directed to providing a connector capable of efficiently utilizing a space of a display device.

Furthermore, the present invention is directed to providing a modular connector including a plurality of ports.

TECHNICAL SOLUTION

In accordance with one aspect of the present disclosure, a connector configured to be mounted on a display device receiving a signal from an external device, the connector comprises a body, a plurality of connection terminals provided on one side of the body and connected to a cable to which the external device is connected, and a printed circuit board (PCB) connection terminal provided on the other side of the body and mounted on the display device, wherein the body, the plurality of connection terminals, and the PCB connection terminal are provided as a single module.

The PCB connection terminal may be provided on a rear surface of the display device.

The plurality of connection terminals may be provided on one surface of the body, and the PCB connection terminal is provided on the other surface adjacent to the one surface.

Some of the plurality of connection terminals may be provided on one surface of the body and the remaining connection terminals may be provided on the other surface opposite the one surface.

Among the plurality of connection terminals, a connection terminal receiving a video image signal may be provided on the one surface of the body and a connection terminal receiving an audio signal may be provided on the other surface of the body.

The plurality of connection terminals may comprise three connection terminals receiving a video image signal.

The plurality of connection terminals may comprise two connection terminals receiving an audio signal.

The plurality of connection terminals may comprise an identification terminal for recognizing whether the external device is connected to the connection terminal receiving a video image signal or the connection terminal receiving an audio signal.

When the PCB connection terminal is mounted on the display device, the plurality of connection terminals may be provided on both side surfaces of the body.

The plurality of connection terminals may be provided on one surface of the body.

When the PCB connection terminal is mounted on the display device, the plurality of connection terminals may be provided on a lower surface of the body.

When the PCB connection terminal is mounted on the display device, the PCB connection terminal may be electrically connected to a PCB substrate located in the display device.

In accordance with one aspect of the present disclosure, a connector configured to be detachably mounted on a display device, the connector comprises a body, a PCB connection terminal provided on one side of the body and mounted on a rear surface of the display device, a plurality of connection terminals provided on the other surface adjacent to one surface of the body, wherein when the PC connection terminal is mounted on the rear surface of the display device, the plurality of connection terminals are located on the side of the body so that the cables connected to the plurality of connection terminals are not protruded to the side of the display device.

The plurality of connection terminals may be provided on a left side of the body, and the PCB connection terminal is provided on a right side adjacent to the one surface.

Some of the plurality of connection terminals may be provided on a left side of the body and the remaining connection terminals may be provided on a right side of the body.

The plurality of connection terminals may be provided on a lower surface of the body.

The plurality of connection terminals may be directly connected to the body without another configuration such as a cable.

When the PCB connection terminal is mounted on the display device, the PCB connection terminal may be electrically connected to a PCB substrate located in the display device.

A cable connected to an external device may be connected to the plurality of connection terminals.

The cable may be connected to an external device that outputs an analog signal.

The plurality of connection terminals may include at least one identification terminal, and the identification terminal may recognize whether an external device is connected through another connection terminal.

Advantageous Effects

According to the connector according to one embodiment, it is possible to prevent a periphery of a display device from becoming disordered by a cable connecting an external device and the display device.

In addition, it is possible to reduce a manufacturing cost of the connector.

DESCRIPTION OF DRAWINGS

FIG. 1 is a view illustrating a state in which an external device and a display device are connected.

FIG. 2 is a rear view illustrating the display device according to one embodiment.

FIG. 3A is a view illustrating a connector according to one embodiment, FIG. 3B is a view illustrating another example of the connector.

FIG. 4 is a view illustrating a connector according to one embodiment.

FIGS. 5 and 6 are views illustrating a state in which the connector according to one embodiment is coupled to the display device.

FIG. 7A is a view illustrating a connector according to another embodiment.

FIG. 7B is a view illustrating another example of the connector.

FIG. 8 is a view illustrating a connector according to another embodiment.

FIGS. 9 and 10 are views illustrating a state in which the connector according to another embodiment is coupled to the display device.

MODES OF THE INVENTION

Hereinafter, a connector according to one embodiment will be described in detail with reference to the accompanying drawings.

FIG. 1 is a view illustrating a state in which an external device and a display device are connected.

Referring to FIG. 1, a display device 1 may be connected to and used in conjunction with various external devices such as a set-top box 2, a variety of audio/video (A/V) devices 3, and the like. The display device 1 may be provided with input ports 11 and 12 which may be connected to the set-top box 2 and the A/V device 3.

The display device 1 may include a display panel capable of displaying input information as an image and an audio device for outputting the input information as a sound. The audio device may also be located outside the display device 1 and connected to the display device 1 by a cable or the like.

The display device 1 may receive digital information through the external device such as the set-top box 2 or the like, and may display an image. In addition, a sound may be output through the audio device provided in the display device 1 or a sound may also be output through the audio device connected to the display device 1.

The display device 1 may include a display part 10 displaying the input information as an image and a base 20 supporting the display part 10. The input ports 11 and 12 for connecting the display device 1 and the external device may be provided on a side surface or a rear surface of the display part 10. Output ports (not shown) provided in the external devices 2 and 3 may be connected to the input ports 11 and 12 provided in the display part 10 by cables C.

In order for the external devices such as the set-top box 2 or the like and the display device 1 to be linked and normally operated, the input ports provided in the display device 1 have to be accurately connected to the corresponding output ports provided in the external devices. In order to receive signals of many external devices, the display device 1 may be provided with a plurality of input ports corresponding to the external devices.

A digital signal transmission scheme has been widely employed in recently manufactured electronic devices. However, since there are external devices that transmit signals in a conventional analog scheme, the display device 1 has to be provided with a separate port capable of receiving an analog signal.

Unlike a digital scheme, since an analog signal is vulnerable to signal interference, cables which each transmit a specific signal need to be separately provided. For example, a cable for transmitting a video signal and a cable for transmitting an audio signal should be separately provided. In addition, as the cable for transmitting a video signal, cables which transmit color signals, such as a blue signal, a red signal, and a green signal, should be separately provided.

Therefore, in order for an analog signal to be input, the display device 1 should be provided with the plurality of input ports. However, since there is a restriction on a space in the display device 1 in which the input ports are disposed, it is difficult for all of the input ports for receiving an analog signal to be placed in the restricted space.

In a conventional case, one component output port and one A/V output port are provided in a side surface of the display device, and a connector in which a plurality of cables are connected to one connection jack is employed. Each of the cables is connected to one of the output ports of the external device outputting the analog signal. In this case, an unnecessarily extended cable is placed on the connector and causes an increase in a material cost thereof, and the cable of the connector protrudes toward a side surface of the display device such that an external appearance of the display device is spoiled.

Generally, the display device is located near a wall, and, when the connector is provided on a rear surface of the display device, the connector and a part of the cable protrude from the rear surface of the display device such that there is an inconvenience in that the display device is inevitably installed a certain distance from the wall.

FIG. 2 is a rear view illustrating the display device according to one embodiment, FIG. 3A is a view illustrating a connector according to one embodiment, FIG. 3B is a view illustrating another example of the connector, FIG. 4 is a view illustrating a connector according to one embodiment, and FIGS. 5 and 6 are views illustrating a state in which the connector according to one embodiment is coupled to the display device.

Referring to FIGS. 2 to 6, the display device 1 according to one embodiment may be provided with one input port 100 capable of receiving an analog signal. The input port 100 may be located at a rear surface of the display device 1. An insertion hole 130 is provided in one side of a rear cover 13 which forms a rear external appearance of the display device 1, and a connector 4 may be provided to be inserted into and mounted in the input port 100 through the insertion hole 130.

Since the input port 100 is provided in the rear surface of the display device 1, it is possible to improve space availability of the display device 1. That is, by providing input terminals to which an external device adopting a digital transmission scheme, which has a high frequency of use, may be connected on a side surface of the display device 1 and installing the input port 100 capable of receiving a signal of an external device adopting an analog transmission scheme, which has a lower frequency of use than the external device adopting the digital transmission scheme, on the rear surface of the display device 1, a plurality of input terminals may be efficiently disposed on the display device 1.

Further, the connector 4 is provided to be detachably mounted on the display device 1. When an external device transmitting a signal in an analog transmission scheme is not employed, the connector 4 may not be connected to the display device 1. When an external device transmitting a signal in an analog transmission scheme is employed, a user may mount the connector 4 in the input port 100 and then connect the external device thereto. Since the connector 4 is detachably provided as described above, it is possible to improve the user's convenience. When an external device transmitting a signal in an analog transmission scheme is not used, the connector 4 is not mounted on the display device 1, and thus it is possible to prevent the display device from having a non-slim external appearance due to the protrusion of the connector 4 from an external surface of the display device 1.

The connector 4 may include a body 40 and a plurality of connection terminals provided on the body 40. As one example, as shown in FIG. 3A, connection terminals 41a to 41e provided on the connector 4 according to one embodiment may be composed of five connection terminals. The plurality of connection terminals 41a to 41e may include three connection terminals 41a to 41c for transmitting a video image signal and two connection terminals 41d and 41e for transmitting an audio signal.

As another example, as shown in FIG. 3B, the connector 4a may be provided with six connection terminals 44a to 44f on a body 43. The plurality of connection terminals 44a to 44f may be composed of three connection terminals 44a to 44c for transmitting a component video signal, one connection terminal 44d for transmitting an AV image signal, and two connection terminals 44e and 44f for transmitting an audio signal.

The number of connection terminals provided on the connector is not limited to the numbers described above.

The connector 4 provided with five connection terminals as shown in FIG. 3A will be described below.

As described above, a connection structure of the connector 4 may be simplified by modularizing and integrally providing the plurality of connection terminals 41a to 41e in one connector 4, and the connector 4 simplifies a structure for connecting an external device to the connector 4 so that it is possible to avoid spoiling the external appearance of the periphery of the display device 1. In comparison to a conventional connector in which connection terminals are provided at a plurality of cables, the manufacturing cost of the connector 4 may be reduced.

The plurality of connection terminals 41a to 41e may be provided on both opposite side surfaces of the body 40. For example, the three connection terminals 41a to 41c for transmitting a video image signal may be located on one side surface of the body 40, and the two connection terminals 41d and 41e for transmitting an audio signal may be provided on the other side surface of the body 40 opposite the one side thereof.

Two connection terminals of the three connection terminals 41a to 41c provided on the one side surface of the body 40 may be transmission terminals to which a video image signal is transmitted, and the remaining one connection terminal may be an identification terminal for recognizing whether the external device is connected to the transmission terminal to which the video image signal is transmitted. The two transmission terminals may be a component terminal and an A/V terminal. The identification terminal may recognize the external device connected to the component terminal or the A/V terminal to transmit a signal corresponding thereto to the display device 1.

Similarly, one of the two connection terminals 41d and 41e transmitting an audio signal may be a transmission terminal for transmitting an audio signal, and the other terminal may be an identification terminal for recognizing whether an audio device is connected to the transmission terminal.

The connector 4 further includes a printed circuit board (PCB) connection terminal 42 mounted in the input port 100 provided on the display device 1. The PCB connection terminal 42 may be mounted in the input port 110 to be electrically connected to a PCB substrate 14 located in the display device 1.

The PCB connection terminal 42 may be located between one surface on which the video connection terminals 41a to 41c are provided and the other surface on which the audio connection terminals 41d and 41e are provided. When the body 40 is formed in a polygonal shape, the PCB connection terminal 42 may be located on a connection surface connecting the one surface and the other surface of the body 40.

When the PCB connection terminal 42 is mounted in the input port 100 located at the rear surface of the display device 1, the plurality of connection terminals 41a to 41e may be located on both sides of the connector 4. For example, when the rear surface of the display device 1 is viewed from the front thereof, the three connection terminals 41a to 41c transmitting a video image signal may be located on a left side surface of the connector 4 and the two connection terminals 41d and 41e transmitting an audio signal may be located on a right side surface of the connector 4.

An external device which transmits a video signal or an audio signal in an analog transmission scheme among external devices such as a set-top box, an audio device, and the like may be connected to the connector 4 via the cable C. Therefore, the external device may be connected to the display device 1 to transmit a video signal or an audio signal to the display device 1.

Since the cable C is connected to the connection terminals provided on both side surfaces of the connector 4, the cable C does not protrude toward a rear side of the display device 1. Therefore, even when the external device is connected using the connector 4, there is no need to move the display device 1 forward and the display device 1 may be placed near a wall. That is, a range of the user's choice with respect to the location of the display device 1 may be widened.

In this case, since the connector 4 is placed on the rear surface of the display device 1, even when the cable C is connected to the side surface of the connector 4, the cable C may not protrude from a side of the display device 1. Even when the cable C is connected to the connector 4, the cable C extending downward from a rear side of the display part 10 may be seen in front of the display device 1, but the cable C does not appear to protrude from a side portion of the display part 10.

Even when a conventional connector is connected to a side portion or a rear portion of a display part, a portion of the connector to which a plurality of cables are connected is seen to protrude from a side portion of the display part so that an overall aesthetic appearance of the display device may be spoiled. In the connector according to the present disclosure, however, the cable does not protrude from a side portion of the display device 1 so that the connector does not spoil the external appearance of the display device 1.

FIG. 7A is a view illustrating a connector according to another embodiment, FIG. 7B is a view illustrating another example of the connector, FIG. 8 is a view illustrating a connector according to another embodiment, and FIGS. 9 and 10 are views illustrating a state in which the connector according to another embodiment is coupled to the display device.

Referring to FIGS. 7A to 10, in a connector 5 according to another embodiment, all of a plurality of connection terminals 51a to 51e and 46a to 46f may be provided on one surface of a body 50. A configuration of the connector 5 shown in FIGS. 7A to 10 partially differs from that of the connector 4 shown in FIGS. 1 to 6. However, the structure related to the connector 4 and the display device 1 shown in FIGS. 1 to 6 may be similarly applied to a structure in which the connector 5 is coupled to the rear side of the display device 1 and the plurality of connection terminals are modularized and integrally provided.

The connector 5 shown in FIG. 7A may include the body 50 and the plurality of connection terminals 51a to 51e provided on the body 50. The plurality of connection terminals 51a to 51e may be connection terminals capable of transmitting a signal transmitted in an analog scheme.

As one example, the plurality of connection terminals 51a to 51e may include three connection terminals for transmitting a video image signal and two connection terminals for transmitting an audio signal. Any one of the five connection terminals 51a to 51e may be a terminal for recognizing whether an external device transmitting a video image signal is connected and another one connection terminal thereof may be a terminal for recognizing whether an external device transmitting an audio signal is connected.

A connector 4b shown in FIG. 7B includes a body 45 and six connection terminals 46a to 46f provided on the body 45. Three connection terminals 46a to 46c of the six connection terminals 46a to 46f are terminals for transmitting a component image signal, one connection terminal 46d is a terminal for transmitting an AV image signal, and two connection terminal 46e and 46f are terminals for transmitting an audio signal.

The number of connection terminals provided on the connector is not limited to the number described above.

A configuration of the connector 5 shown in FIG. 7A will be described below. Similar to the connector 4 shown in FIGS. 1 to 6, the connector 5 according to another embodiment may be coupled to the input port 100 via the insertion hole 130 provided in the rear cover 13 of the display device 1. The connector 5 is provided with a PCB connection terminal 52 coupled to the input port 100. When the PCB connection terminal 52 is coupled to the input port 100, the connector 5 may be electrically connected to the PCB substrate 14 located in the display device 1.

The PCB connection terminal 52 may be located on one surface adjacent to the other surface of the body 50 on which the plurality of connection terminals 51a to 51e are located. The connector may be provided such that when the connector is mounted on the rear side of the display device 1, the plurality of connection terminals 51a to 51e are located on a lower surface of the body 50.

The cable C connected to an external device may be connected to the plurality of connection terminals 51a to 51e located at a lower portion of the connector 5. Since the cable C extends downward from a lower surface of the connector 5, the cable C may not protrude from a side portion of the display device 1. Therefore, it is possible to prevent the cables C connected to the external device from spoiling a surrounding aesthetic appearance of the display device 1.

Further, since the connection terminals are provided on the lower surface of the connector 5 and the cable is connected to the connection terminal, the cable may not protrude from a rear side of the connector 5. Therefore, even when an external device is connected to the display device 1 through the connector 5, it is possible to maintain a state in which the display device 1 is placed near a wall without moving the display device forward. That is, a range of the user's choice with respect to the location of the display device 1 may not be limited.

The connector 5 is provided integrally with the plurality of connection terminals 51a to 51e so that a manufacturing cost of the connector can be reduced and a simple connection portion between the cable C and the connector 5 can be embodied in comparison to a conventional connector.

The connector 5 is provided to be detachable from the display device 1. The connector 5 is provided to be coupled to the display device 1 when it is necessary to connect an external device to the display device so that it is possible to improve convenience for the user. When there is no need to connect the display device to an external device, the connector 5 may be detached from the display device 1 so that it is possible to prevent degradation of an aesthetic appearance of the display device 1 due to an unnecessary configuration being coupled to the display device 1.

Although embodiments in which five connectors are provided in each of the connectors 4 and 5 is given in the above description, the number of connectors provided in each of the connectors 4 and 5 is not limited to the number described above. In addition, although the above description states that, when each of the connector 4 and 5 is coupled to the rear surface of the display device 1, the connection terminals are located on both side surfaces or a lower surface of each of the connectors 4 and 5, it is also possible for the connection terminals to be provided on another surface of each of the connectors 4 and 5 such as upper surfaces of the connectors 4 and 5.

In the case of the present disclosure, by integrally modularizing the plurality of connection terminals on each of the connectors 4 and 5 and coupling the connector to the rear surface of the display device, connection configurations using the connectors 4 and 5 are simplified and it is possible to reduce the manufacturing cost of the connectors 4 and 5 and to prevent degradation of an overall aesthetic appearance of the display device 1 by a connection portion between each of the connectors 4 and 5 and the cable C.

The invention claimed is:

1. A connector configured to be mounted on a display device receiving a signal from an external device, the connector comprising:
   a body;
   a plurality of connection terminals provided on at least a first side of the body and configured to be connected to a cable to which the external device is connected; and
   a printed circuit board (PCB) connection terminal provided on a second side of the body and configured to be mounted on a rear surface of the display device,
   wherein the body, the plurality of connection terminals, and the PCB connection terminal are provided as a single module,
   wherein the plurality of connection terminals comprise a connection terminal configured to receive a video image signal and a connection terminal configured to receive an audio signal, and
   wherein the connector is configured to be detachably mounted on the rear surface of the display device.

2. The connector of claim 1, wherein the PCB connection terminal is configured to be mounted in an input port provided on the rear surface of the display device.

3. The connector of claim 1, wherein the first side of the body on which the plurality of connection terminals are provided is perpendicular to the second side of the body on which the PCB connection terminal is provided.

4. The connector of claim 1, wherein at least one connection terminal of the plurality of connection terminals is provided on the first side of the body and at least one remaining connection terminal of the plurality of connection terminals is provided on a third side of the body that is opposite the one first side of the body.

5. The connector of claim 4, wherein the connection terminal configured to receive the video image signal is provided on the first side of the body and the connection terminal configured to receive the audio signal is provided on the third side of the body.

6. The connector of claim 5, wherein the plurality of connection terminals comprise three connection terminals configured to receive the video image signal.

7. The connector of claim 5, wherein the plurality of connection terminals comprise two connection terminals configured to receive the audio signal.

8. The connector of claim 5, wherein the plurality of connection terminals further comprise an identification terminal configured to recognize whether the external device is connected to the connection terminal configured to receive the video image signal or the connection terminal configured to receive the audio signal.

9. The connector of claim 4, wherein the first side and the third side of the body are perpendicular to the second side of the body.

10. The connector of claim 1, wherein the plurality of connection terminals are provided on only the first side of the body.

11. The connector of claim 10, wherein the first side of the body on which the plurality of connection terminals are provided is a lower side of the body.

12. The connector of claim 1, wherein the PCB connection terminal is configured to be electrically connected to a PCB substrate included in the display device.

* * * * *